(12) United States Patent
Tian et al.

(10) Patent No.: US 12,446,297 B2
(45) Date of Patent: Oct. 14, 2025

(54) LOW VOLTAGE TRIGGERING SILICON CONTROLLED RECTIFIER

(71) Applicant: Shanghai Huali Integrated Circuit Corporation, Shanghai (CN)

(72) Inventors: Zhi Tian, Shanghai (CN); Tao Liu, Shanghai (CN); Feng Ji, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 420 days.

(21) Appl. No.: 18/201,440

(22) Filed: May 24, 2023

(65) Prior Publication Data
US 2024/0113209 A1    Apr. 4, 2024

(30) Foreign Application Priority Data
Sep. 29, 2022   (CN) .......................... 202211197965.5

(51) Int. Cl.
*H10D 84/00* (2025.01)
*H10D 84/40* (2025.01)

(52) U.S. Cl.
CPC .......... *H10D 84/138* (2025.01); *H10D 84/401* (2025.01)

(58) Field of Classification Search
CPC ...... H10D 84/138; H10D 84/401; H10D 8/80; H10D 64/111; H10D 62/115; H10D 62/126; H10D 89/713
USPC ....................................................... 257/133
See application file for complete search history.

(56) References Cited

U.S. PATENT DOCUMENTS

| | | | |
|---|---|---|---|
| 9,882,003 B1* | 1/2018 | Aharoni | H10D 89/811 |
| 2006/0262471 A1* | 11/2006 | Van Camp | H10D 18/251 |
| | | | 361/56 |
| 2007/0170512 A1* | 7/2007 | Gauthier, Jr. | H10D 86/01 |
| | | | 257/357 |
| 2007/0279824 A1* | 12/2007 | Mallikarjunaswamy | ...... |
| | | | H10D 89/713 |
| | | | 257/E29.225 |
| 2014/0124828 A1* | 5/2014 | Salman | H10D 18/251 |
| | | | 257/107 |
| 2015/0137174 A1* | 5/2015 | Lee | H01L 23/62 |
| | | | 257/133 |
| 2016/0093622 A1* | 3/2016 | Luan | H10D 62/133 |
| | | | 257/133 |
| 2016/0133621 A1* | 5/2016 | Liu | H10D 8/01 |
| | | | 257/133 |
| 2016/0141287 A1* | 5/2016 | He | H10D 84/0109 |
| | | | 257/133 |
| 2016/0149021 A1* | 5/2016 | Schmenn | H10D 84/135 |
| | | | 257/133 |

(Continued)

*Primary Examiner* — Sheikh Maruf
(74) *Attorney, Agent, or Firm* — Banner & Witcoff, Ltd.

(57) ABSTRACT

The present application discloses a low voltage triggering silicon controlled rectifier which includes: an N well and a P well forming a PN junction, a first P+ region formed in the N well and connected to an anode, and a first N+ region formed in the P well and connected to a cathode. A second P+ region is formed in the N well at the PN junction and diffuses into the P well. A second N+ region is formed in the P well at the PN junction and diffuses into the N well. A first gate structure connected to the anode is formed at the surface of the N well between the first and second P+ regions; and a second gate structure connected to the cathode is formed at the surface of the P well between the first and second N+ regions.

15 Claims, 5 Drawing Sheets

(56) References Cited

U.S. PATENT DOCUMENTS

| | | | |
|---|---|---|---|
| 2016/0163690 A1* | 6/2016 | Ko ........................ | H10D 89/713 |
| | | | 257/133 |
| 2016/0181400 A1* | 6/2016 | Qian .................... | H10D 30/603 |
| | | | 438/286 |
| 2022/0173093 A1* | 6/2022 | Yang .................... | H10D 89/713 |

* cited by examiner

LOW VOLTAGE TRIGGERING SILICON CONTROLLED RECTIFIER

CROSS-REFERENCES TO RELATED APPLICATIONS

This application claims the priority to Chinese patent application No. 202211197965.5, filed on Sep. 29, 2022, and entitled "LOW VOLTAGE TRIGGERING SILICON CONTROLLED RECTIFIER", the content of which is incorporated herein by reference in its entirety.

TECHNICAL FIELD

The present application relates to a semiconductor integrated circuit, and particularly to a low voltage triggering (LUT) silicon controlled rectifier (SCR).

BACKGROUND

As semiconductor integrated circuit manufacturing process continuously improves, the thickness of a gate oxide layer of a transistor has become ever smaller, leading to continuous decreasing of the breakdown voltage and operating voltage of the gate oxide layer in a transistor. In addition, the chip operating voltage has a slower decreasing rate than both the decreasing rate of the breakdown voltage of the gate oxide layer of the transistor and the decreasing rate of the breakdown voltages of a source or a drain. Therefore, electrostatic discharge (ESD) material selections are extremely limited due to the already narrow ESD design window which has to add a safety margin of 10% which must be taken into consideration when designing ESD protection devices. A silicon controlled rectifier is the most robust ESD protection device per unit device area and can be viewed as a positive feedback loop consisting of two parasitic transistors PNP and NPN. The IV curve thereof represents a very significant hysteresis characteristics which often has a very low holding voltage, so it can easily lead to a latch-up effect.

Grounded-gate NMOS (GGNMOS) can be triggered by the breakdown voltage of a junction between a N+ region/P well (Pwell) and has a relatively low trigger voltage. However, a study shows that embedding the GGNMOS in a SCR can effectively reduce the trigger voltage, and such a new structure is named as an N-type low voltage triggering silicon controlled rectifier (NLVTSCR). The GGNMOS accelerates the triggering process for the SCR, but the strong hysteresis of the SCR leads to a still low holding voltage of the NLVTSCR, with a high latch-up risk. Similarly, P-type low voltage triggering silicon controlled rectifiers (PLVTSCR) with a low trigger voltage have been developed by embedding gate-to-VDD PMOS (GDPMOS) in a SCR structure.

Referring to FIG. 1A, which is the cross sectional diagram of an existing NLVTSCR structure; referring to FIG. 1B, which is the top-view diagram of an existing NLVTSCR structure; referring to FIG. 1C, which is a perspective diagram of an existing NLVTSCR structure; referring to FIG. 1D, which is a circuit diagram showing parasitic elements in an existing NLVTSCR. An existing NLVTSCR includes:

an N well 102 and a P well 103 formed on a semiconductor substrate 101, and the second side of the N well 102 and the first side of the P well 103 are in contact to form a PN junction. The semiconductor substrate 101 is a P-type semiconductor substrate, the semiconductor substrate 101 is also represented by Psub in FIG. 1C; the N well 102 is also represented by N well; and the P well 103 is also represented by P well.

A first P+ region 105a is formed in a selected region of the N well 102, the first P+ region 105a is connected to an anode including a metal layer 110, and the anode is formed by patterning of the metal layer 110. In FIG. 3A, the top of the first P+ region 105a is connected to the metal layer 110 corresponding to the anode by a contact hole 109.

A first N+ region 106a is formed in a selected region of the P well 103, and the first N+ region 106a is connected to a cathode including to a metal layer 110; and a silicon controlled rectifier is formed by the first P+ region 105a, the N well 102, the P well 103 and the first N+ region 106a between the anode and the cathode.

A second N+ region 106c is formed in a selected region of the P well 103 at the PN junction and the second N+ region 106c is also across the PN junction to enter the N well 102.

A gate structure is formed at the surface of the P well 103 between the first N+ region 106a and the second N+ region 106c, the gate structure is formed by superimposing a gate dielectric layer 107 and a gate conductive material layer 108, and the gate conductive material layer 108 is connected to the cathode; GGNMOS includes the first N+ region 106a, the gate structure, the second N+ region 106c, and the P well 103 between the first N+ region 106a and the second N+ region 106c; and the first N+ region 106a is the source region of the GGNMOS and the second N+ region 106c is the drain region of the GGNMOS.

The NLVTSCR includes the silicon controlled rectifier and the GGNMOS.

The total conduction path of the NLVTSCR includes a conduction path 112 between the source and drain regions of the GGNMOS and a conduction path 111 of the silicon controlled rectifier. In FIG. 1C, the conduction path 112 is also represented by GGNMOS path and the conduction path 111 is also represented by SCR path.

A third N+ region 106b is formed in a selected region of the N well 102, and the third N+ region 106b is connected to the anode.

A third P+ region 105b is formed in a selected region of the P well 103, and the third P+ region 105b is connected to the cathode.

The second side of the third N+ region 106b and the first side of the first P+ region 105a are isolated by a field oxide 104.

The first side of the second N+ region 106c and the second side of the first P+ region 105a is isolated by the field oxide 104.

The first side of the third P+ region 105b and the second side of the first N+ region 106a are either in direct contact or isolated by the field oxide 104.

The field oxide 104 is provided outside the first side of the third N+ region 106b.

The field oxide 104 is provided outside the second side of the third P+ region 105b.

Referring to FIG. 1D, the silicon controlled rectifier includes parasitic PNP and NPN; the source region, P well 103 and drain region of the GGNMOS also form a parasitic NPN. When triggered, the drain region of the GGNMOS, i.e., a region between the second N+ region 106c and the P well 103, would be subjected to avalanche breakdown, and an avalanche current would flow through the parasitic resistor Rnw of the N well 102 and the parasitic resistor Rpw of the P well 103. The increase in the voltage across the parasitic resistor Rnw would enable conduction of the PNP, and the increase in the voltage across the parasitic resistor Rpw would enable conduction of the parasitic PNP of the NPN and GGNMOS.

Referring to FIG. 2A, which is a cross sectional diagram of an existing PLVTSCR structure; referring to FIG. 2B, which is a top-view diagram of the existing PLVTSCR structure; referring to FIG. 2C, which is a perspective diagram of the existing PLVTSCR structure; referring to FIG. 2D, which is a circuit diagram showing parasitic elements in the existing PLVTSCR structure. The existing PLVTSCR structure includes:

an N well 202 and a P well 203 formed on a semiconductor substrate 201, and the second side of the N well 202 and the first side of the P well 203 are in contact to form a PN junction. The semiconductor substrate 201 is a P-type semiconductor substrate, and the semiconductor substrate 201 is also represented by Psub in FIG. 2C; the N well 202 is also represented by N well; and the P well 203 is also represented by P well.

A first P+ region 205a is formed in a selected region of the N well 202, the first P+ region 205a is connected to an anode including a metal layer 120, and the anode is formed by patterning of the metal layer 120. In FIG. 3A, the top of the first P+ region 205a is connected to the metal layer 120 corresponding to the anode by a contact hole 209.

A first N+ region 206a is formed in a selected region of the P well 203, and the first N+ region 206a is connected to a cathode including a metal layer 120; and a silicon controlled rectifier is formed by the first P+ region 205a, the N well 202, the P well 203 and the first N+ region 206a between the anode and the cathode.

A second P+ region 205c is formed in a selected region of the N well 202 at the PN junction, and the second P+ region 205c is also across the PN junction to enter the P well 203.

A gate structure is formed at the surface of the N well 202 between the first P+ region 205a and the second P+ region 205c, the gate structure is formed by superimposing a gate dielectric layer 207 and a gate conductive material layer 208, and the gate conductive material layer 208 is connected to the anode; the first P+ region 205a, the gate structure, the second P+ region 205c, and GDPMOS is formed by the N well 202 between the first P+ region 205a and the second P+ region 205c, the first P+ region 205a is the source region of the GDPMOS, and the second P+ region 205c is the drain region of the GDPMOS.

A PLVTSCR is formed by the silicon controlled rectifier and the GDPMOS.

The total conduction path of the PLVTSCR includes a conduction path 212 between the source and drain regions of the GDPMOS and a conduction path 211 of the silicon controlled rectifier. In FIG. 2C, the conduction path 212 is also represented by GDPMOS path and the conduction path 211 is also represented by SCR path.

A third N+ region 206b is formed in a selected region of the N well 202, and the third N+ region 206b is connected to the anode.

A third P+ region 205b is formed in a selected region of the P well 203, and the third P+ region 205b is connected to the cathode.

The second side of the third N+ region 206b and the first side of the first P+ region 205a are isolated by the field oxide 204.

The second side of the second P+ region 205c and the first side of the first N+ region 206a are isolated by the field oxide 204.

The first side of the third P+ region 205b and the second side of the first N+ region 206a are isolated by field oxide 204.

The field oxide 204 is provided outside the first side of the third N+ region 206b.

The field oxide 204 is provided outside the second side of the third P+ region 205b.

Referring to FIG. 2D, the silicon controlled rectifier includes parasitic PNP and NPN; and the source region, N well 202 and drain region of the GDPMOS also form parasitic PNP. When triggered, the drain region of the GDPMOS, i.e., a region between the second P+ region 205c and the N well 202, would be subjected to avalanche breakdown, and an avalanche current would flow through the parasitic resistor Rnw of the N well 202 and the parasitic resistor Rpw of the P well 203. The increase in the voltage across the parasitic resistor Rnw would enable conduction of the PNP and the parasitic PNP of GDPMOS; and the increase in the voltage across the parasitic resistor Rpw would enable the conduction of the NPN.

BRIEF SUMMARY

According to some embodiments in this application, a low voltage triggering silicon controlled rectifier including:

an N well and a P well formed on a semiconductor substrate, wherein the second side of the N well and the first side of the P well are in contact to form a PN junction.

A first P+ region is formed in a selected region of the N well, and the first P+ region is connected to an anode including a metal layer.

A first N+ region is formed in a selected region of the P well, and the first N+ region is connected to a cathode including a metal layer; and a silicon controlled rectifier is formed by the first P+ region, the N well, the P well and the first N+ region between the anode and the cathode.

A second P+ region is formed in a selected region of the N well at the PN junction, and the second P+ region is also across the PN junction to enter the P well.

A second N+ region is formed in a selected region of the P well at the PN junction and the second N+ region is also across the PN junction to enter the N well; and the second P+ region and the second N+ region are isolated by a first field oxide.

A first gate structure is formed at the surface of the N well between the first P+ region and the second P+ region, the first gate structure is formed by superimposing a first gate dielectric layer and a first gate conductive material layer, and the first gate conductive material layer is connected to the anode; and a GDPMOS includes the first P+ region, the first gate structure, the second P+ region, and the N well between the first P+ region and the second P+ region, the first P+ region is the source region of the GDPMOS and the second P+ region is the drain region of the GDPMOS.

A second gate structure is formed at the surface of the P well between the first N+ region and the second N+ region, the second gate structure is formed by superimposing a second gate dielectric layer and a second gate conductive material layer, and the second gate conductive material layer is connected to the cathode; GGNMOS includes the first N+ region, the second gate structure, the second N+ region and the P well between the first N+ region and the second N+ region; and the first N+ region is the source region of the GGNMOS and the second N+ region is the drain region of the GGNMOS.

A low voltage triggering silicon controlled rectifier includes the silicon controlled rectifier, the GDPMOS and the GGNMOS;

A P+N junction is formed by the drain region of the GDPMOS and the N well, and a N+P junction is formed by the drain region of the GGNMOS and the P well, the P+N junction and N+P junction work together as a trigger structure for the conduction of the low voltage triggering silicon controlled rectifier to adjust and reduce the trigger voltage.

The total conduction path of the low voltage triggering silicon controlled rectifier includes a first conduction path between the source and drain regions of the GDPMOS, a second conduction path between the source and drain regions of the GGNMOS and a third conduction path of the silicon controlled rectifier, shunting is performed for the total conduction path by the first conduction path and the second conduction path to reduce the current in the third conduction path, thereby adjusting and boosting the holding voltage.

In some cases, in the top view, the first P+ region and the first N+ region are in a strip structure and their extending directions are parallel, the interface of the PN junction is perpendicular to the top surface of the substrate 101, and the extending direction of the PN junction is parallel to the length direction of the first P+ region.

The second P+ region includes a first main portion and more than one first extension portions, the first main portion is in a strip structure and parallel to the first P+ region, the first main portion is located in the N well, each of the first extension portions and the first main portion are intersected perpendicularly, the first side of each of the first extension portions is in contact with the first main portion, and the second side of each of the first extension portions is extended into the P well.

The second N+ region includes a second main portion and more than one second extension portions, the second main portion is in a strip structure and parallel to the second P+ region, the second main portion is located in the P well, the second extension portions and the second main portion are intersected perpendicularly, the second side of the second extension portions is in contact with the second main portion, and the first side of the second extension portions is extended into the N well.

The first extension portions and the second extension portions are staggered in the extension direction of the PN junction.

In some cases, the first extension portions and the second extension portions are the same in number.

In some cases, each of the first extension portions has the same length and each of the first extension portions has the same width.

In some cases, the length of each of the second extension portions is equal to that of the first extension portions.

The width of each of the second extension portions is equal to that of the first extension portions.

In some cases, the width of the first main portion and the width of the second main portion are the same.

In some cases, a third N+ region is formed in a selected region of the N well, and the third N+ region is connected to the anode.

The third N+ region is located outside the first side of the first P+ region, and the distance between the third N+ region and the PN junction is greater than the distance between the first P+ region and the PN junction.

In some cases, a third P+ region is formed in a selected region of the P well, and the third P+ region is connected to the cathode.

The third P+ region is located outside the second side of the first N+ region, and the distance between the third P+ region and the PN junction is greater than the distance between the first N+ region and the PN junction.

In some cases, the second side of the third N+ region and the first side of the first P+ region are either in direct contact or isolated by a field oxide.

In some cases, the first side of the third P+ region and the second side of the first N+ region are either in direct contact or isolated by a field oxide.

In some cases, a field oxide is provided outside the first side of the third N+ region.

In some cases, a field oxide is provided outside the second side of the third P+ region.

In some cases, the semiconductor substrate is a P-type semiconductor substrate.

In some cases, a plurality of the low voltage triggering silicon controlled rectifiers are simultaneously on the same semiconductor substrate, each of the low voltage triggering silicon controlled rectifiers has the same or different trigger voltage, the magnitude of the trigger voltage is adjusted by the total area of the PN junction and the N+P junction, and the larger the total area of the PN junction and the N+P junction is, the smaller the trigger voltage of the low voltage triggering silicon controlled rectifier is.

In some cases, a plurality of the low voltage triggering silicon controlled rectifiers are simultaneously integrated on the same semiconductor substrate, each of the low voltage triggering silicon controlled rectifiers has the same or different holding voltages, the magnitude of the holding voltages are adjusted by the sum of the currents of the first conduction path and the second conduction path, and the greater the sum of the currents of the first conduction path and the second conduction path is, the greater the holding voltages of the low voltage triggering silicon controlled rectifiers will be.

The low voltage triggering silicon controlled rectifier of the present application is achieved by inserting both the GGNMOS and GDPMOS on the basis of a silicon controlled rectifier. The GGNMOS has a second N+ region across the PN junction of the N and P wells of the silicon controlled rectifier and the GDPMOS has a second P+ region across the PN junction of the N and P wells of the silicon controlled rectifier. Upon ESD events, the P+N junction formed by the second P+ region and the N well and the N+P junction formed by the second N+ region and the P well are both subjected to avalanche breakdown. The current from positive holes of the avalanche breakdown current of the P+N junction and the current of positive holes the avalanche breakdown current of the N+P junction both flow to the P well and finally to the cathode. The current from electrons of the avalanche breakdown current of the P+N junction and the electron current of the avalanche breakdown current of the N+P junction both flow to the N well and finally to the anode. When the P well voltage obtained by multiplying the hole current flowing through the P well by the parasitic resistance of the P well is increased to the voltage that enables the p-n junction, e.g., greater than 0.7V, the parasitic NPN of the silicon controlled rectifier and the parasitic NPN between the source and drain regions of the GGNMOS would conduct. When the N well voltage obtained by multiplying the electron current flowing through the N well by the parasitic resistance of the N well is decreased to the voltage that enables the n-p junction, e.g., when the N well voltage is more than 0.7V smaller than the anode voltage, the parasitic PNP of the silicon control rectifier and the parasitic PNP between the source and drain regions of the GDPMOS would conduct, so that the conduction paths of the GDPMOS, GGNMOS and silicon control rectifier would be triggered and the low voltage triggering silicon controlled rectifier would be triggered. Since the electron flow in the N well and the hole flow in the P well are superimposed currents, the change rates for the P well voltage and the N well voltage can be increased, thereby effectively reducing the trigger voltage of the silicon controlled rectifier. Since the trigger voltage of the low voltage triggering silicon controlled rectifier is determined by the trigger voltage of the silicon controlled rectifier, the trigger voltage of the low voltage triggering silicon controlled rectifier can be reduced.

In addition, in the structure of the present application, it is easy to adjust the structures of the GGNMOS and GDP-MOS, for example, adjusting the areas of the P+N junction and N+P junction. Therefore, in the present application, it is easy to realize the adjustment of the magnitude of the trigger voltage of the low voltage triggering silicon controlled rectifier. That is how to facilitate to make a variety of low voltage triggering silicon controlled rectifiers with different trigger voltages on the same semiconductor substrate, therefore it is possible for chips that function with different trigger voltages when using the low voltage triggering silicon controlled rectifiers.

In addition, upon ESD events, the GGNMOS and GDP-MOS of the present application can also provide conduction paths at the surface of the semiconductor substrate, i.e., the first conduction path and second conduction path which are located in the parasitic triode formation between the source and drain regions of the GGNMOS and GDPMOS, respectively, so as to reduce the current in the third conduction path in the silicon controlled rectifier located inside the semiconductor substrate. For the silicon controlled rectifier, the smaller the conduction current is, the higher the holding voltage is. Thus, in the present application, the holding voltage of the low voltage triggering silicon controlled rectifier can also be increased. Moreover, since the holding voltage can be adjusted by the magnitude of the current of the conduction paths of the GGNMOS and GDPMOS, and the magnitude of the current of the conduction paths of the GGNMOS and GDPMOS is completely determined by the structures of the GGNMOS and GDPMOS, finally in the present application, the holding voltage can be adjusted by setting the structures of the GGNMOS and GDPMOS to realize controllable adjustment of the holding voltage of the low voltage triggering silicon controlled rectifier.

Since the first conduction path and second conduction path for adjusting the holding voltage are located at the surface of the semiconductor substrate in the present application, the latch-up risk can also be reduced.

BRIEF DESCRIPTION OF THE DRAWINGS

The present application is described in further detail below in conjunction with the figures and specific embodiments.

DETAILED DESCRIPTION OF THE DISCLOSURE

Figure 1A:
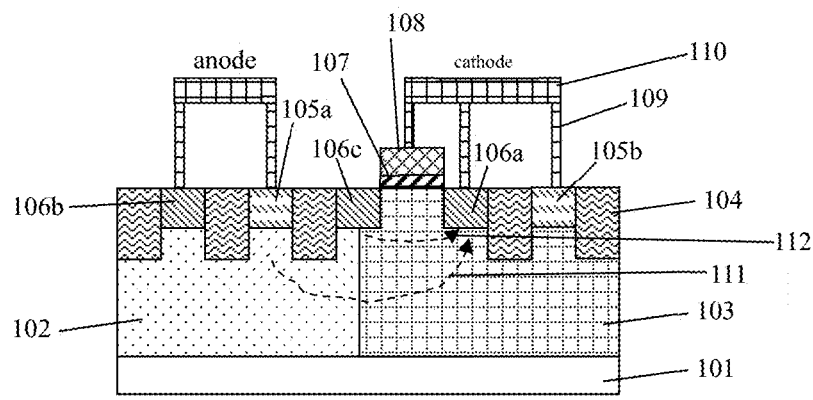
FIG. 1A is a cross sectional diagram of an existing NLVTSCR structure.
Figure 1B:
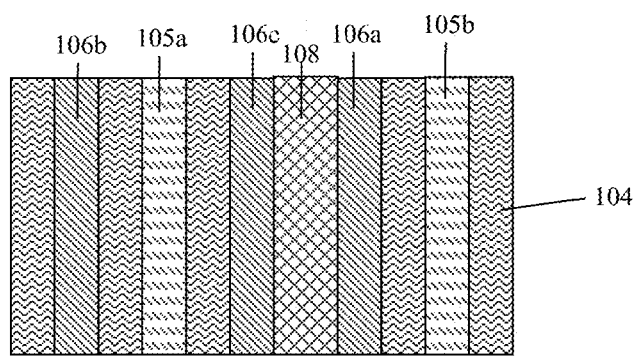
FIG. 1B is a top-view diagram of an existing NLVTSCR structure.
Figure 1C:
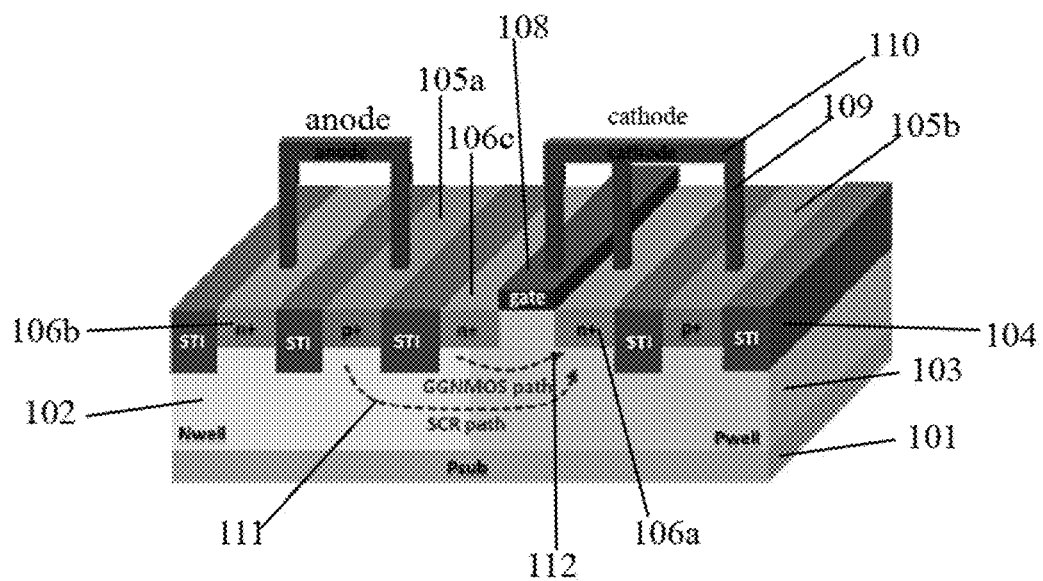
FIG. 1C is a perspective diagram of an existing NLVTSCR structure.
Figure 1D:
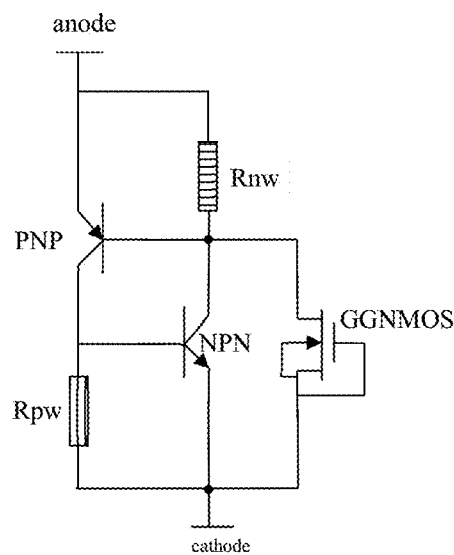
FIG. 1D is a diagram of a parasitic circuit of an existing NLVTSCR.
Figure 2A:
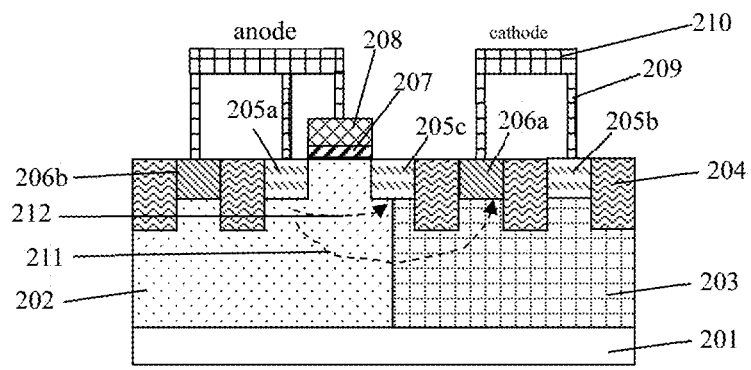
FIG. 2A is a cross sectional structural diagram of an existing PLVTSCR.
Figure 2B:
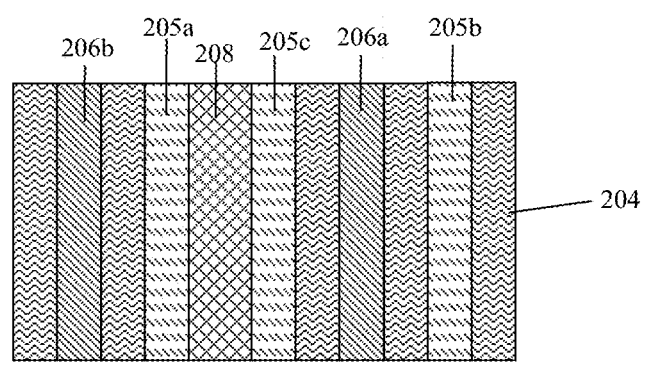
FIG. 2B is a top-view diagram of an existing PLVTSCR structure.
Figure 2C:
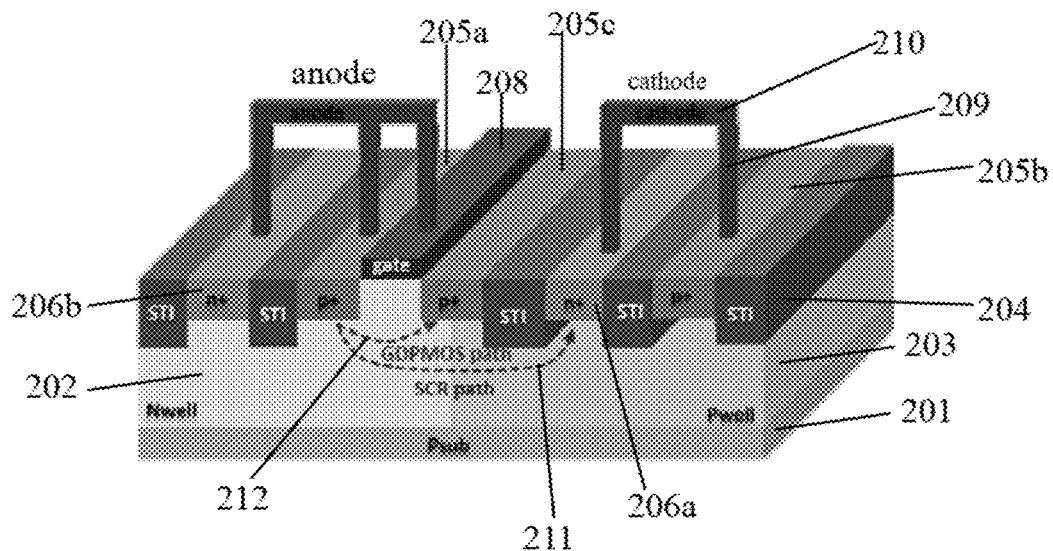
FIG. 2C is a perspective diagram of an existing PLVTSCR structure.
Figure 2D:
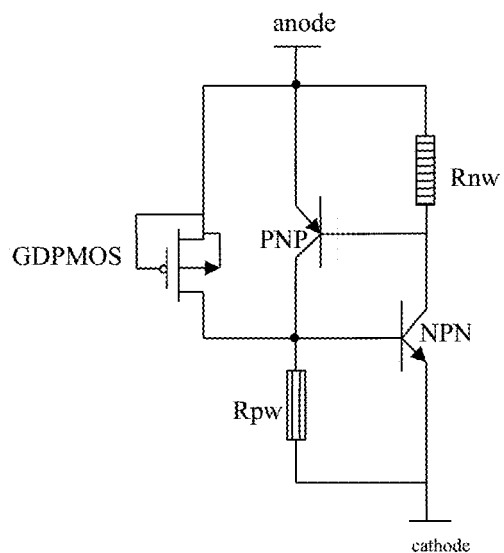
FIG. 2D is a circuit diagram showing parasitic elements of an existing PLVTSCR.
Figure 3A:
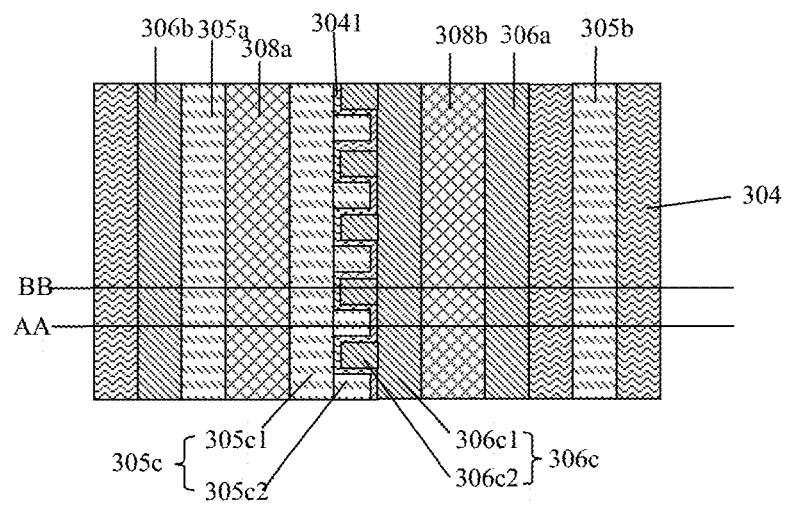
FIG. 3A is a top-view diagram of an LVTSCR structure according to an embodiment of the present application.
Figure 3B:
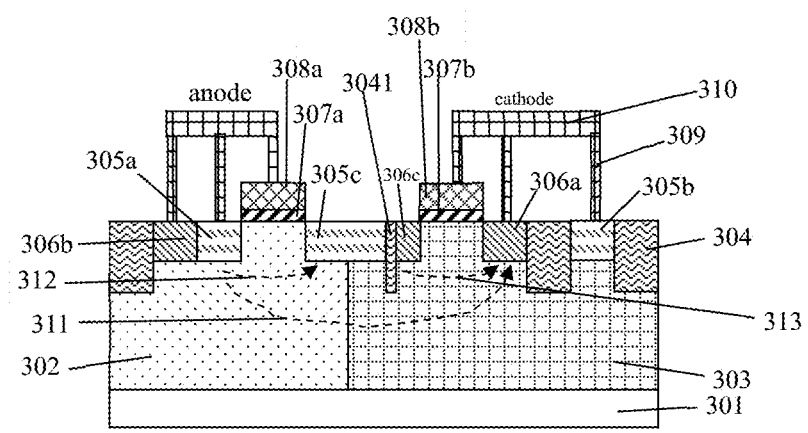
FIG. 3B is a cross sectional diagram along line AA in FIG. 3A.
Figure 3C:
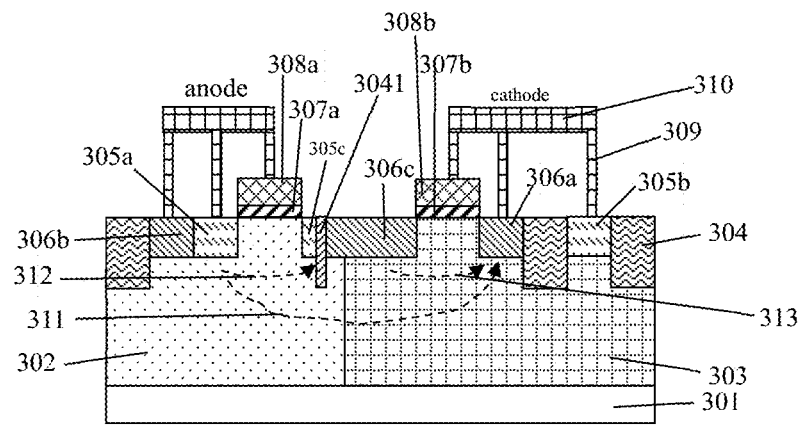
FIG. 3C is a cross sectional diagram along line BB in FIG. 3A.
Figure 3D:
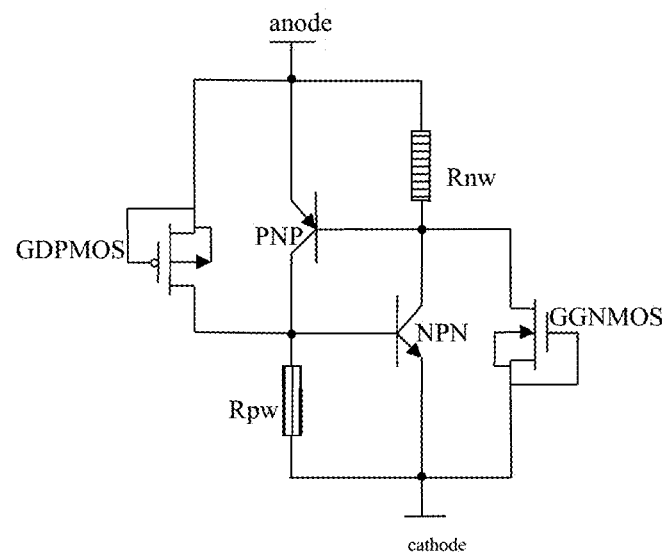
FIG. 3D is a circuit diagram showing parasitic elements of an LVTSCR according to an embodiment of the present application

Referring to FIG. 3A, it is a top-view diagram of an LVTSCR structure according to an embodiment of the present application; referring to FIG. 3B, it is a cross sectional diagram along line AA of FIG. 3A; referring to FIG. 3C, it is a cross sectional diagram along line BB of FIG. 3A; referring to FIG. 3D, it is a circuit diagram showing parasitic elements of an LVTSCR according to an embodiment of the present application; and an low voltage triggering silicon controlled rectifier of an embodiment of the present application includes:

an N well 302 and a P well 303 formed on a semiconductor substrate 301, and the second side of the N well 302 and the first side of the P well 303 are in contact to form a PN junction.

A first P+ region 305a is formed in a selected region of the N well 302, the first P+ region 305a is connected to an anode including a metal layer 310, and the anode is form by patterning of the metal layer 310. In FIG. 3A, the top of the first P+ region 305a is connected to the metal layer 310 corresponding to the anode by a contact hole 309.

A first N+ region 306a is formed in a selected region of the P well 303, the first N+ region 306a is connected to a cathode including a metal layer 310; and a silicon controlled rectifier is formed by the first P+ region 305a, the N well 302, the P well 303 and the first N+ region 306a between the anode and the cathode.

A second P+ region 305c is formed in a selected region of the N well 302 at the PN junction and the second P+ region 305c is also across the PN junction to enter the P well 303.

A second N+ region 306c is formed in a selected region of the P well 303 at the PN junction and the second N+ region 306c is also across the PN junction to enter the N well 302; and the second P+ region 305c and the second N+ region 306c are isolated by a first field oxide 304l.

A first gate structure is formed at the surface of the N well 302 between the first P+ region 305a and the second P+ region 305c, the first gate structure is formed by superimposing a first gate dielectric layer 307a and a first gate conductive material layer 308a, and the first gate conductive material layer 308a is connected to the anode; a GDPMOS includes the first P+ region 305a, the first gate structure, the second P+ region 305c and the N well 302 between the first P+ region 305a and the second P+ region 305c, the first P+ region 305a is the source region of the GDPMOS and the second P+ region 305c is the drain region of the GDPMOS.

A second gate structure is formed at the surface of the P well 303 between the first N+ region 306a and the second N+ region 306c, the second gate structure is formed by superimposing a second gate dielectric layer 307b and a second gate conductive material layer 308b, and the second gate conductive material layer 308b is connected to the cathode; GGNMOS includes the first N+ region 306a, the second gate structure, the second N+ region 306c and the P well 303 between the first N+ region 306a and the second N+ region 306c; and the first N+ region 306a is the source region of the GGNMOS and the second N+ region 306c is the drain region of the GGNMOS.

A low voltage triggering silicon controlled rectifier includes the silicon controlled rectifier, the GDPMOS and the GGNMOS.

The P+N junction, formed by the drain region of the GDPMOS and the N well 302, and the N+P junction, formed by the drain region of the GGNMOS and the P well 303, work together as a trigger structure for the conduction of the low voltage triggering silicon controlled rectifier to adjust and reduce the trigger voltage. Referring to FIG. 3D, the silicon controlled rectifier includes parasitic PNP and NPN; a parasitic PNP would also be formed in the source region, N well 302 and drain region of the GDPMOS; and a parasitic NPN would also be formed in the source regions, P well 303 and drain region of the GGNMOS. When triggered, the drain region of the GDPMOS, i.e. a region between the second P+ region 305c and the N well 302, would be subjected to avalanche breakdown when an avalanche current would flow through the parasitic resistor Rnw of the N well 302 and the parasitic resistor Rpw of the P well 303; the drain region of the GGNMOS, i.e. a region between the second N+ region 306c and the P well 303, would be subjected to avalanche breakdown, and the avalanche current would flow through the parasitic resistor Rnw of the N well 302 and the parasitic resistor Rpw of the P well 303. After the voltage across the parasitic resistor Rnw is increased, the PNP and the parasitic PNP of the GDPMOS conduct; and after the voltage across the parasitic resistor Rpw is increased, the NPN and the parasitic PNP of GGNMOS conduct.

The total conduction path of the low voltage triggering silicon controlled rectifier includes a first conduction path 312 between the source and drain regions of the GDPMOS, a second conduction path 313 between the source and drain regions of the GGNMOS and a third conduction path 313 of the silicon controlled rectifier, and shunting is performed for the total conduction path by the first conduction path 312 and the second conduction path 313 to reduce the current in the third conduction path 313 and thereby adjust and boost the holding voltage.

In an embodiment of the present application, referring to FIG. 3A, in a top view, the first P+ region 305a and the first N+ region 306a are in a strip structure and parallel, and the extension direction of the PN junction is parallel to the length direction of the first P+ region 305a.

The second P+ region 305c includes a first main portion 305c1 and more than one first extension portions 305c2, the first main portion 305c1 is in a strip structure extending in a direction parallel to the first P+ region 305a, the first main portion 305c1 is located inside the N well 302, each of the first extension portions 305c2 and the first main portion 305c1 are perpendicularly intersected, the first side of each the first extension portions 305c2 is in contact with the first main portion 305c1, and the second side of each the first extension portions 305c2 is extended into the P well 303.

The second N+ region 306c includes a second main portion 306c1 and more than one second extension portions 306c2, the second main portion 306c1 is in a strip structure and parallel to the second P+ region 305c, the second main portion 306c1 is located in the P well 303, the second extension portions 306c2 and the second main portion 306c1 are perpendicularly intersected, the second side of the second extension portion 306c2 is in contact with the second main portion 306c1, and the first side of the second extended portion 306c2 is extended into the N well 302.

The first extension portions 305c2 and the second extension portions 306c2 are staggered in the extension direction of the PN junction.

In some embodiments, the number of the first extension portions 305c2 and the number of the second extension portions 306c2 are the same. In other embodiments, it can also be that the number of the first extension portions 305c2 and the number of the second extension portions 306c2 are not the same.

In some embodiments, the plurality of the first extension portions 305c2 have the same length and the same width. In other embodiments, it can also be that the first extension portions 305c2 do not all have identical lengths, e.g., some of the first extension portions 305c2 have the same length and others have different lengths; or, it can also be that each length of the first extension portions 305c2 is unique, e.g., these lengths would be varied gradually. In addition, the first extension portions 305c2 do not have identical widths, e.g., some of the first extension portions 305c2 have the same width and others of the first extension portions 305c2 have different widths; or, each width of the first extension portions 305c2 is unique, e.g., these widths can vary incrementally from one to another.

In some embodiments, when the length of each first extension portions 305c2 is the same, the length of each of the second extension portions 306c2 is equal to the length of the first extension portions 305c2, and when the width of each first extension portions 305c2 is the same, the width of each of the second extension portions 306c2 is equal to the width of the first extension portions 305c2. In other embodiments, it can also be that the second extension portions 306c2 do not have identical lengths, for example, some of the second extension portions 306c2 have the same length and others of the second extension portions 306c2 have different lengths; or, the length of each of the second extension portions 306c2 is unique, e.g., these lengths would be varied gradually from one to another. The second extension portions 306c2 do not have identical widths, e.g., some of the second extension portions 306c2 have the same width and others of the second extension portions 306c2 have different widths; or, each width of the second extension portions 306c2 is unique, e.g., these widths can vary gradually from one to another.

In some embodiments, the width of the first main portion 305c1 and the width of the second main portion 306c1 are the same. In other embodiments it can also be that the width of the first main portion 305c1 and the width of the second main portion 306c1 are different.

In embodiments of the present application, a third N+ region 306b is formed in a selected region of the N well 302, and the third N+ region 306b is connected to the anode.

The third N+ region 306b is located outside the first side of the first P+ region 305a, and the distance between the third N+ region 306b and the PN junction is greater than the distance between the first P+ region 305a and the PN junction.

A third P+ region 305b is formed in a selected region of the P well 303, and the third P+ region 305b is connected to the cathode.

The third P+ region 305b is located outside a second side of the first N+ region 306a, and the distance between the third P+ region 305b and the PN junction is greater than the distance between the first N+ region 306a and the PN junction.

In some embodiments, the second side of the third N+ region 306b and the first side of the first P+ region 305a are in direct contact. In other embodiments, it can also be that the second side of the third N+ region 306b and the first side of the first P+ region 305a are isolated by a field oxide 304.

The first side of the third P+ region 305b and the second side of the first N+ region 306a are either in direct contact or isolated by the field oxide 304.

The field oxide 304 is provided outside the first side of the third N+ region 306b.

The field oxide 304 is provided outside the second side of the third P+ region 305b.

In FIG. 3B, the field oxides 304 in each region have the same structure and are formed in the same process at the same time, e.g., all in shallow trench isolation (STI), wherein the field oxide located between the second P+ region 305c and the second N+ region 306c is separately defined as a first field oxide and separately labeled with a reference numeral 3041.

According to the embodiments of the present application, the semiconductor substrate 301 is a P-type semiconductor substrate 301.

In some embodiments, a plurality of the low voltage triggering silicon controlled rectifiers are integrated simultaneously on the same semiconductor substrate 301, each of the plurality of low voltage triggering silicon controlled rectifiers has either the same or different trigger voltages, the magnitudes of the trigger voltages are adjusted based on the total area of the P+N junction and the N+P junction, and the larger the total area of the P+N junction and the N+P junction is, the smaller the trigger voltage of the low voltage triggering silicon controlled rectifier will be.

A plurality of the low voltage triggering silicon controlled rectifiers are simultaneously integrated on the same semiconductor substrate 301, each of the low voltage triggering silicon controlled rectifiers has either the same or different holding voltages, the magnitudes of the holding voltages are adjusted based on the sum of the currents of the first conduction path 312 and the second conduction path 313, and the larger the sum of the currents of the first conduction path 312 and the second conduction path 313 is, the greater the holding voltage of the low voltage triggering silicon controlled rectifier is. The current of the first conduction path 312 can be achieved by adjusting the structural parameters of the GDPMOS, for example, the length of the first gate structure, and the doping concentrations for the N well 302, and the source and drain regions of the GDPMOS. The current of the second conduction path 313 can be achieved by adjusting structural parameters of the GGNMOS, for example, the length of the second gate structure, and the doping concentrations for the P well 303, and the source and the drain regions of the GGNMOS.

In an embodiment of the present application, polycrystalline silicon gates or metal gates are used both for the first gate conductive material layer 308a and the second gate conductive material layer 308b.

The materials for the first gate dielectric layer 307a and the second gate dielectric layer 307b are the same, and the material for the first gate dielectric layer 307a includes a silicon dioxide or high dielectric constant layer.

The low voltage triggering silicon controlled rectifier of the embodiment of the present application is achieved by inserting both the GGNMOS and GDPMOS on the basis of a silicon controlled rectifier, the GGNMOS has a second N+ region 306c across the PN junction between the N well 302 and P well 303 of the silicon controlled rectifier and the GDPMOS has a second P+ region 305c across the PN junction between the N well 302 and P well 303 of the silicon controlled rectifier. Upon ESD events, the P+N junction formed by the second P+ region 305c and the N well 302 and the N+P junction formed by the second N+ region 306c and the P well 303 would both be subjected to avalanche breakdown. The current from positive holes of the avalanche breakdown current of the P+N junction and the current from positive holes of the avalanche breakdown current of the N+P junction would both flow to the P well 303 and finally to the cathode, and the electron current of the avalanche breakdown current of the P+N junction and the electron current of the avalanche breakdown current of the N+P junction flow to the N well 302 and finally to the anode. When the voltage of the P well 303 obtained by multiplying the hole current flowing through P well 303 by the parasitic resistance of P well 303 is increased to the voltage that enables the p-n junction, for example, greater than 0.7V, the parasitic NPN of the silicon controlled rectifier and the parasitic NPN between the source and drain regions of the GGNMOS would conduct. When the N well 302 voltage obtained by multiplying the electron current flowing through the N well 302 by the parasitic resistance of the N well 302 is reduced to the voltage that enables the n-p junction, for example, when the N well 302 voltage is more than 0.7V smaller than the anode voltage, the parasitic PNP of the silicon control rectifier and the parasitic PNP between the source and drain regions of the GDPMOS would conduct, so that the conduction paths of the GDPMOS, GGNMOS and silicon control rectifier are all triggered and thus the low voltage triggering silicon controlled rectifier is triggered. Since the electron current of the N well 302 and the current from positive holes of P well 303 are superimposed currents, the change rates of the voltages of the P well 303 and N well 302 can be increased, thereby effectively reducing the trigger voltage of the silicon control rectifier. Since the trigger voltage of the low voltage triggering silicon controlled rectifier is determined by the trigger voltage of the silicon controlled rectifier, the trigger voltage of the low voltage triggering silicon controlled rectifier can be reduced.

In addition, in the structure of the embodiment of the present application, it is easy to adjust the structures of the GGNMOS and GDPMOS, for example, adjusting the areas of the P+N junction and N+P junction. Therefore, in the embodiment of the present application, it is easy to realize the adjustment of the magnitude of the trigger voltage of the low voltage triggering silicon controlled rectifier. That is how to facilitate to make a variety of low voltage triggering silicon controlled rectifiers with different trigger voltages on the same semiconductor substrate 301 at the same time, so as to be suitable for chips that need to use low voltage triggering silicon controlled rectifiers with different trigger voltages.

In addition, upon ESD events, the GGNMOS and GDPMOS of the embodiment of the present application can also provide conduction paths at the surface of the semiconductor substrate 301, i.e., the first conduction path 312 and the second conduction path 313 which are located in the parasitic triode formation between the source and drain regions of the GGNMOS and GDPMOS, respectively, so as to reduce the current in the third conduction path 313 of the silicon controlled rectifier located inside the semiconductor substrate 301. For the silicon controlled rectifier, the smaller the conduction current is, the higher the holding voltage is. Therefore, in the embodiment of the present application, the holding voltage of the low voltage triggering silicon controlled rectifier can also be increased. Moreover, since the holding voltage can be adjusted by the magnitude of the current of the conduction paths of the GGNMOS and GDPMOS, and the magnitude of the current of the conduction path of the GGNMOS and GDPMOS is completely determined by the structures of the GGNMOS and GDPMOS, finally in the embodiment of the present application, the holding voltage can be adjusted by setting the structures of the GGNMOS and GDPMOS to realize controllable adjustment of the holding voltage of the low voltage triggering silicon controlled rectifier.

Since the first conduction path 312 and the second conduction path 313, which are used to adjust the holding voltage, are located at the surface of the semiconductor substrate 301, the latch-up risk is also reduced.

The above detailed description of the present application by means of specific embodiments is provided, but is not intended to limit the present application. Without departing from the principle of the present application, a person skilled in the art may also make many variations and improvements which should also be within the scope of protection of the present application.

What is claimed is:

1. A low voltage triggering silicon controlled rectifier, comprising:
    an N well and a P well formed on a semiconductor substrate, wherein a second side of the N well and a first side of the P well are in contact to form a PN junction;
    a first P+ region formed in a selected region of the N well, wherein the first P+ region is connected to an anode, wherein the anode comprises a metal layer;
    a first N+ region formed in a selected region of the P well, wherein the first N+ region is connected to a cathode, wherein the cathode comprises a metal layer;
    a silicon controlled rectifier formed by the first P+ region, the N well, the P well and the first N+ region between the anode and the cathode;
    a second P+ region formed in a selected region of the N well at the PN junction, wherein the second P+ region extends into the P well by crossing the PN junction;
    a second N+ region formed in a selected region of the P well at the PN junction, wherein the second N+ region extends into the N well by crossing the PN junction;
    wherein the second P+ region and the second N+ region are isolated by a first field oxide;
    a first gate structure formed at a surface of the N well between the first P+ region and the second P+ region, wherein the first gate structure is formed by superimposing a first gate dielectric layer and a first gate conductive material layer, wherein the first gate conductive material layer is connected to the anode;
    a GDPMOS made of the first P+ region, the first gate structure, the second P+ region and the N well between the first P+ region and the second P+ region, wherein the first P+ region forms a source region of the GDPMOS and the second P+ region forms a drain region of the GDPMOS;
    a second gate structure formed at a surface of the P well between the first N+ region and the second N+ region, wherein the second gate structure is formed by superimposing a second gate dielectric layer and a second gate conductive material layer, wherein the second gate conductive material layer is connected to the cathode;
    a GGNMOS made of the first N+ region, the second gate structure, the second N+ region and the P well between the first N+ region and the second N+ region; and
    wherein the first N+ region forms a source region of the GGNMOS and the second N+ region forms a drain region of the GGNMOS;
    wherein the silicon controlled rectifier, the GDPMOS and the GGNMOS constitute the low voltage triggering silicon controlled rectifier;
    a P+N junction formed of the drain region of the GDPMOS and the N well; and
    a N+P junction formed of the drain region of the GGNMOS and the P well;
    wherein the P+N junction and the N+P junction work together as a trigger structure for conducting the low voltage triggering silicon controlled rectifier to adjust and reduce a trigger voltage;
    and
    a conduction path of the low voltage triggering silicon controlled rectifier comprises a first conduction path between the source region and the drain region of the GDPMOS, a second conduction path between the source region and the drain region of the GGNMOS, and a third conduction path of the silicon controlled rectifier, wherein shunting is performed for the first conduction path and the second conduction path to reduce a current in the third conduction path, wherein a holding voltage of the silicon controlled rectifier can be adjusted and boosted.

2. The low voltage triggering silicon controlled rectifier according to claim 1, wherein the first P+ region and the first N+ region each comprises a strip structure andare parallel to each other, and the PN junction extends in a direction parallel to a length direction of the strip structure of the first P+ region;
    wherein the second P+ region comprises a first main portion and more than one first extension portions, wherein the first main portion comprises a strip structure which is parallel to the strip structure of the first P+ region, wherein the first main portion is located in the N well, wherein each of the more than one first extension portions are intersects the first main portion perpendicularly, wherein a first side of each of the more than one first extension portions is in contact with the first main portion, and the second side of each of the more than one first extension portions extends into the P well;
    wherein the second N+ region comprises a second main portion and more than one second extension portions, wherein the second main portion comprises a strip structure and is parallel to the strip structure of the second P+ region, wherein the second main portion is located in the P well, wherein each of the more than one second extension portions intersects the second main portion perpendicularly, wherein a second side of each of the more than one second extension portions is in contact with the second main portion, and a first side of each of the more than one second extension portions extends into the N well; and
    wherein the more than one first extension portions and the more than one second extension portions are staggered in the extension direction of the PN junction.

3. The low voltage triggering silicon controlled rectifier according to claim 2, wherein a number of the more than one first extension portions and a number of the more than one second extension portions are equal.

4. The low voltage triggering silicon controlled rectifier as claimed in claim 3, wherein every one of the more than one first extension portions has a same length and every one of the more than one first extension portions has a same width.

5. The low voltage triggering silicon controlled rectifier according to claim 4, wherein the length of each of the more than one second extension portions is equal to the length of each of the more than one first extension portions; and
wherein the width of each of the more than one second extension portions is equal to the width of each of the more than one first extension portions.

6. The low voltage triggering silicon controlled rectifier according to claim 5, wherein a width of the first main portion and a width of the second main portion are a same.

7. The low voltage triggering silicon controlled rectifier according to claim 1, further comprising a third N+ region, wherein the third N+ region is formed in a selected region of the N well, and wherein the third N+ region is connected to the anode; and
wherein the third N+ region is located outside a first side of the first P+ region, and a distance between the third N+ region and the PN junction is greater than a distance between the first P+ region and the PN junction.

8. The low voltage triggering silicon controlled rectifier according to claim 7, wherein a third P+ region is formed in a selected region of the P well, and wherein the third P+ region is connected to the cathode; and
wherein the third P+ region is located outside a second side of the first N+ region, and
wherein a distance between the third P+ region and the PN junction is greater than a distance between the first N+ region and the PN junction.

9. The low voltage triggering silicon controlled rectifier according to claim 7, wherein a second side of the third N+ region and the first side of the first P+ region are either in direct contact or isolated by a field oxide layer.

10. The low voltage triggering silicon controlled rectifier according to claim 8, wherein the first side of the third P+ region and the second side of the first N+ region are either in direct contact or isolated by a field oxide layer.

11. The low voltage triggering silicon controlled rectifier according to claim 9, wherein the field oxide layer is disposed outside a first side of the third N+ region.

12. The low voltage triggering silicon controlled rectifier according to claim 10, wherein the field oxide layer is disposed outside a second side of the third P+ region.

13. The low voltage triggering silicon controlled rectifier according to claim 1, wherein the semiconductor substrate is a P-type semiconductor substrate.

14. An electronic device comprising a plurality of the low voltage triggering silicon controlled rectifier according to claim 1, wherein the plurality of the low voltage triggering silicon controlled rectifiers are simultaneously formed on the semiconductor substrate, wherein each of the plurality of the low voltage triggering silicon controlled rectifiers is configured to have a same or different trigger voltage, wherein a magnitude of the trigger voltage is adjusted based on a total area of the P+N junction and the N+P junction, and wherein a larger total area of the P+N junction and the N+P junction leads to a smaller trigger voltage on the low voltage triggering silicon controlled rectifier.

15. An electronic device comprising a plurality of the low voltage triggering silicon controlled rectifier according to claim 1, wherein the plurality of the low voltage triggering silicon controlled rectifiers are simultaneously integrated on the semiconductor substrate, wherein each of the plurality of the low voltage triggering silicon controlled rectifiers has either a same or different holding voltage, wherein a magnitude of the holding voltage is adjusted based on a sum of a current in the first conduction path and a current in the second conduction path, and wherein a greater sum of the current of the first conduction path and the current in the second conduction path leads to a greater holding voltage of the low voltage triggering silicon controlled rectifier.

* * * * *